United States Patent
Zhang et al.

(10) Patent No.: US 10,686,077 B2
(45) Date of Patent: Jun. 16, 2020

(54) FIN FIELD EFFECT TRANSISTOR (FINFET) DEVICE AND METHOD FOR FORMING THE SAME

(71) Applicant: Taiwan Semiconductor Manufacturing Company, Ltd., Hsinchu (TW)

(72) Inventors: Zhe-Hao Zhang, Hsinchu (TW); Tung-Wen Cheng, New Taipei (TW); Chang-Yin Chen, Taipei (TW); Che-Cheng Chang, New Taipei (TW); Yung-Jung Chang, Cyonglin Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/595,814

(22) Filed: May 15, 2017

(65) Prior Publication Data
US 2017/0250286 A1    Aug. 31, 2017

Related U.S. Application Data

(62) Division of application No. 14/517,310, filed on Oct. 17, 2014, now Pat. No. 9,653,605.

(51) Int. Cl.
*H01L 29/78* (2006.01)
*H01L 29/66* (2006.01)
(Continued)

(52) U.S. Cl.
CPC .... *H01L 29/7851* (2013.01); *H01L 21/30604* (2013.01); *H01L 21/31116* (2013.01); *H01L 21/76224* (2013.01); *H01L 21/823412* (2013.01); *H01L 21/823431* (2013.01); *H01L 21/823481* (2013.01); *H01L 27/0886* (2013.01); *H01L 29/0847* (2013.01);
(Continued)

(58) Field of Classification Search
None
See application file for complete search history.

(56) References Cited

U.S. PATENT DOCUMENTS 7,692,254 B2    4/2010 Anderson et al.
7,755,104 B2    7/2010 Yagishita
(Continued)

FOREIGN PATENT DOCUMENTS

CN    103247535 A    8/2013
CN    103296084 A    9/2013
(Continued)

*Primary Examiner* — William A Harriston
(74) *Attorney, Agent, or Firm* — Slater Matsil, LLP

(57) ABSTRACT

A fin field effect transistor (FinFET) device structure and method for forming FinFET device structure are provided. The FinFET structure includes a substrate and a fin structure extending above the substrate. The FinFET structure includes an epitaxial structure formed on the fin structure, and the epitaxial structure has a first height. The FinFET structure also includes fin sidewall spacers formed adjacent to the epitaxial structure. The sidewall spacers have a second height and the first height is greater than the second height, and the fin sidewall spacers are configured to control a volume and the first height of the epitaxial structure.

20 Claims, 11 Drawing Sheets

(51) Int. Cl.
*H01L 29/165* (2006.01)
*H01L 29/08* (2006.01)
*H01L 27/088* (2006.01)
*H01L 21/762* (2006.01)
*H01L 21/306* (2006.01)
*H01L 21/8234* (2006.01)
*H01L 21/311* (2006.01)

(52) U.S. Cl.
CPC ........ *H01L 29/165* (2013.01); *H01L 29/6653* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 7,799,592 B2 | 9/2010 | Lochtefeld |
| 7,985,633 B2 | 7/2011 | Cai et al. |
| 8,264,021 B2 | 9/2012 | Lai et al. |
| 8,669,607 B1 | 3/2014 | Tsair et al. |
| 8,796,093 B1 | 8/2014 | Cheng et al. |
| 8,890,207 B2 | 11/2014 | Wu et al. |
| 8,980,701 B1 | 3/2015 | Lu et al. |
| 9,171,925 B2 | 10/2015 | Kuo et al. |
| 9,337,285 B2 | 5/2016 | Wann et al. |
| 9,337,315 B2* | 5/2016 | Basker ............... H01L 21/26586 |
| 9,391,200 B2 | 7/2016 | Liu et al. |
| 2005/0239254 A1 | 10/2005 | Chi et al. |
| 2007/0176253 A1* | 8/2007 | Wang ............... H01L 27/10867 257/506 |
| 2008/0132077 A1 | 6/2008 | Morishima |
| 2011/0079829 A1 | 4/2011 | Lai et al. |
| 2012/0319211 A1 | 12/2012 | van Dal et al. |
| 2013/0049068 A1 | 2/2013 | Lin et al. |
| 2013/0084708 A1 | 4/2013 | Jain et al. |
| 2013/0095616 A1 | 4/2013 | Tsai et al. |
| 2013/0122676 A1 | 5/2013 | Jeng |
| 2013/0200455 A1* | 8/2013 | Lo ..................... H01L 29/66795 257/347 |
| 2013/0221443 A1 | 8/2013 | Lin et al. |
| 2013/0228865 A1 | 9/2013 | Lin et al. |
| 2013/0270559 A1 | 10/2013 | Hafez et al. |
| 2013/0285153 A1 | 10/2013 | Lee et al. |
| 2013/0313619 A1 | 11/2013 | Fumitake |
| 2014/0011341 A1 | 1/2014 | Maszara et al. |
| 2014/0035066 A1 | 2/2014 | Tsai et al. |
| 2014/0065782 A1 | 3/2014 | Lu et al. |
| 2014/0106528 A1* | 4/2014 | Quyang ............ H01L 21/8234 438/275 |
| 2014/0117455 A1 | 5/2014 | Liu et al. |
| 2014/0134814 A1* | 5/2014 | Wong ................ H01L 21/82341 438/283 |
| 2014/0167264 A1 | 6/2014 | Besser et al. |
| 2014/0252489 A1 | 9/2014 | Yu et al. |
| 2014/0361373 A1 | 12/2014 | Hung et al. |
| 2014/0363935 A1* | 12/2014 | Fu ..................... H01L 29/66545 438/164 |
| 2014/0374840 A1 | 12/2014 | Lee et al. |
| 2015/0035023 A1 | 2/2015 | Kim et al. |
| 2015/0091100 A1* | 4/2015 | Xie ................... H01L 21/76224 257/401 |
| 2015/0214366 A1 | 7/2015 | Chang et al. |
| 2015/0255352 A1 | 9/2015 | Chuang et al. |
| 2015/0255542 A1* | 9/2015 | Cai .................... H01L 29/1054 257/401 |
| 2015/0255543 A1 | 9/2015 | Cheng et al. |
| 2015/0255576 A1 | 9/2015 | Liao et al. |
| 2015/0270263 A1 | 9/2015 | Zhu |
| 2015/0294969 A1 | 10/2015 | Lee et al. |
| 2015/0303118 A1 | 10/2015 | Wang et al. |
| 2015/0372140 A1* | 12/2015 | Liu ..................... H01L 29/7848 257/190 |
| 2016/0025671 A1 | 1/2016 | Johnson et al. |
| 2016/0049399 A1 | 2/2016 | Park et al. |
| 2016/0087104 A1* | 3/2016 | Lee ................... H01L 29/7851 257/192 |
| 2016/0111420 A1* | 4/2016 | Zhang .............. H01L 29/7851 257/392 |
| 2016/0197075 A1* | 7/2016 | Li ..................... H01L 27/0924 257/369 |
| 2017/0309730 A1 | 10/2017 | Lee et al. |
| 2018/0122908 A1 | 5/2018 | Balakrishnan et al. |

FOREIGN PATENT DOCUMENTS

| | | |
|---|---|---|
| CN | 103681347 A | 3/2014 |
| CN | 103811345 A | 5/2014 |
| JP | 2007294757 A | 11/2007 |
| KR | 20130120973 A | 11/2013 |
| KR | 20140020707 A | 2/2014 |
| KR | 1020140086807 A | 7/2014 |
| TW | I456760 B | 10/2014 |
| TW | I463655 B | 12/2014 |
| TW | I496291 B | 8/2015 |

\* cited by examiner

FIN FIELD EFFECT TRANSISTOR (FINFET) DEVICE AND METHOD FOR FORMING THE SAME

PRIORITY CLAIM AND CROSS-REFERENCE

This claims the benefit of and is a divisional of U.S. patent application Ser. No. 14/517,310, filed on Oct. 17, 2014, and entitled "Fin Field Effect Transistor (finFET) Device and Method for Forming the Same" which application is incorporated herein by reference.

This application is related to the following and commonly assigned patent applications: U.S. patent application Ser. No. 14/517,209 filed on Oct. 17, 2014 and entitled "Fin Field Effect Transistor (FinFET) Device and Method for Forming the Same," U.S. Patent Application Publication No. 62/075,015, filed on Nov. 4, 2014 and entitled "Fin Field Effect Transistor (FinFET) Device and Method for Forming the Same," and U.S. patent application Ser. No. 14/609,088, filed on Jan. 29, 2015 and entitled "Fin Field Effect Transistor (FinFET) Device and Method for Forming the Same."

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
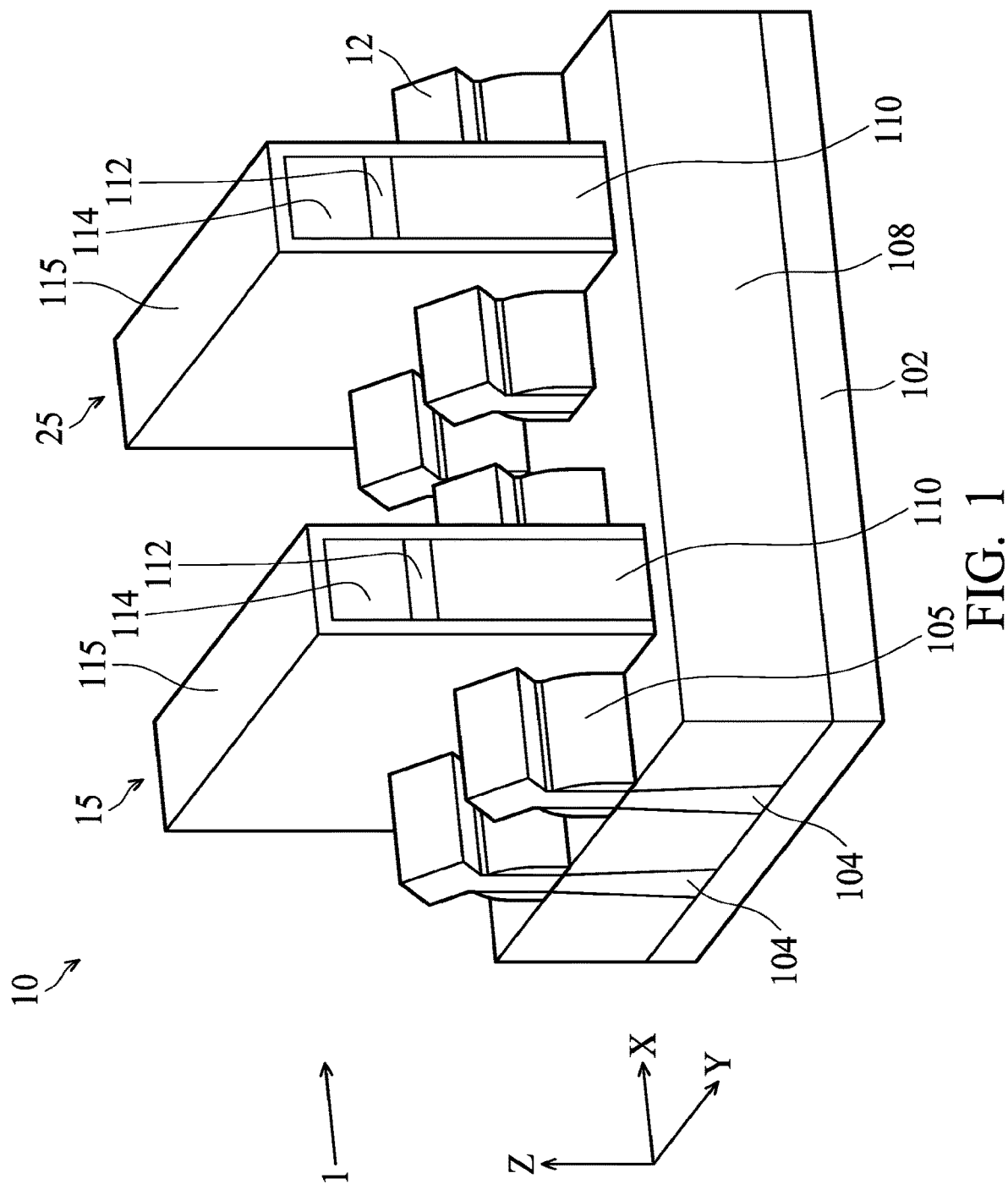
FIG. 1 shows a perspective representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1 shows a perspective representation of a fin field effect transistor (FinFET) device structure 10, in accordance with some embodiments of the disclosure. The FinFET device structure 10 includes a N-type FinFET device structure (NMOS) 15 and a P-type FinFET device structure (PMOS) 25.

The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes one or more fin structure 104 (e.g., Si fins) that extend from the substrate 102. The fin structure 104 may optionally include germanium (Ge). The fin structure 104 may be formed by using suitable processes such as photolithography and etching processes. In some embodiments, the fin structure 104 is etched from substrate 102 using dry etch or plasma processes.

In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 100 further includes a gate stack structure including a gate electrode 110 and a gate dielectric layer (not shown). The gate stack structure is formed over a central portion of the fin structure 104. In some other embodiments, multiple gate stack structures are formed over the fin structure 104.

In some other embodiments, the gate stack structure is a dummy gate stack and is replaced later by a metal gate (MG) after high thermal budget processes are performed.

The Gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include poly silicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FIGS. 2A-2F show side views of various stages of forming a fin field effect transistor (FinFET) device structure, in accordance with some embodiments of the disclosure. FIGS. 2A-2F show side views taken along arrow 1 of FIG. 1 and arrow 1 is parallel to the X-axis.

Figure 2A:
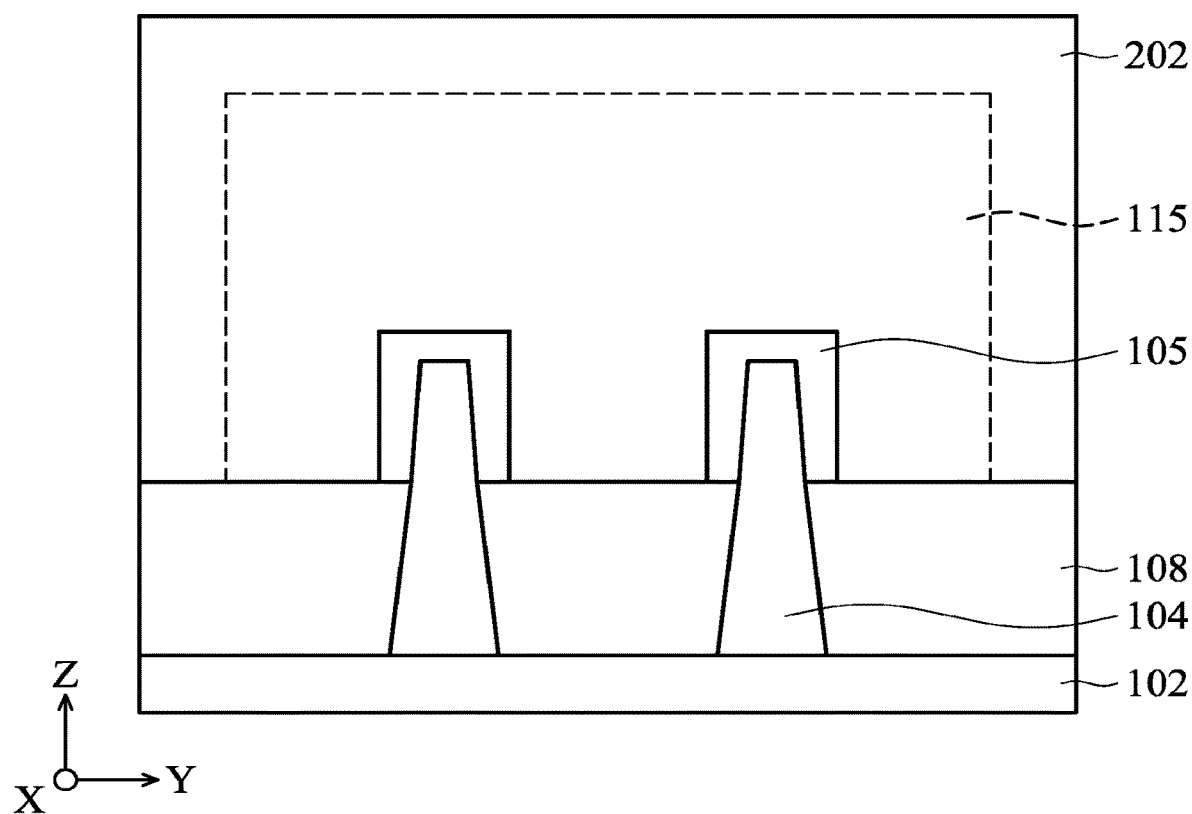
FIGS. 2A-2F show side views of various stages of forming a fin field effect transistor (FinFET) device structure, in accordance with some embodiments of the disclosure.

Referring to FIG. 2A, a first hard mask layer 112 is formed on the gate electrode 110, and a second hard mask layer 114 is formed on the first hard mask layer 112. In some embodiments, the first hard mask layer 112 is made of silicon oxide, silicon nitride, silicon oxynitride, or other applicable materials. In some embodiments, the second hard mask layer 114 is made of silicon oxide, silicon nitride, silicon oxynitride, or other applicable materials.

Gate sidewall spacers 115 are formed on the opposite sidewalls of the gate electrode 110, fin sidewall spacers 105 are formed on the opposite sidewalls of the fin structure 104. Afterwards, a bottom anti-reflective coating (BARC) layer 202 is formed on the gate sidewall spacers 115. The BARC layer 202 is used under a photoresist layer for enhancing pattern transfer to the hard mask layers 112, 114 during a patterning process. In some embodiments, when an implantation process is performed on N-type FinFET device structure (NMOS) 15, the BRAC 202 and a photoresist (not shown) which is formed on the BRAC 202 are formed on the gate electrode 110 to cover the gate electrode 110 in the P-type FinFET device structure (PMOS) 25.

Figure 2B:
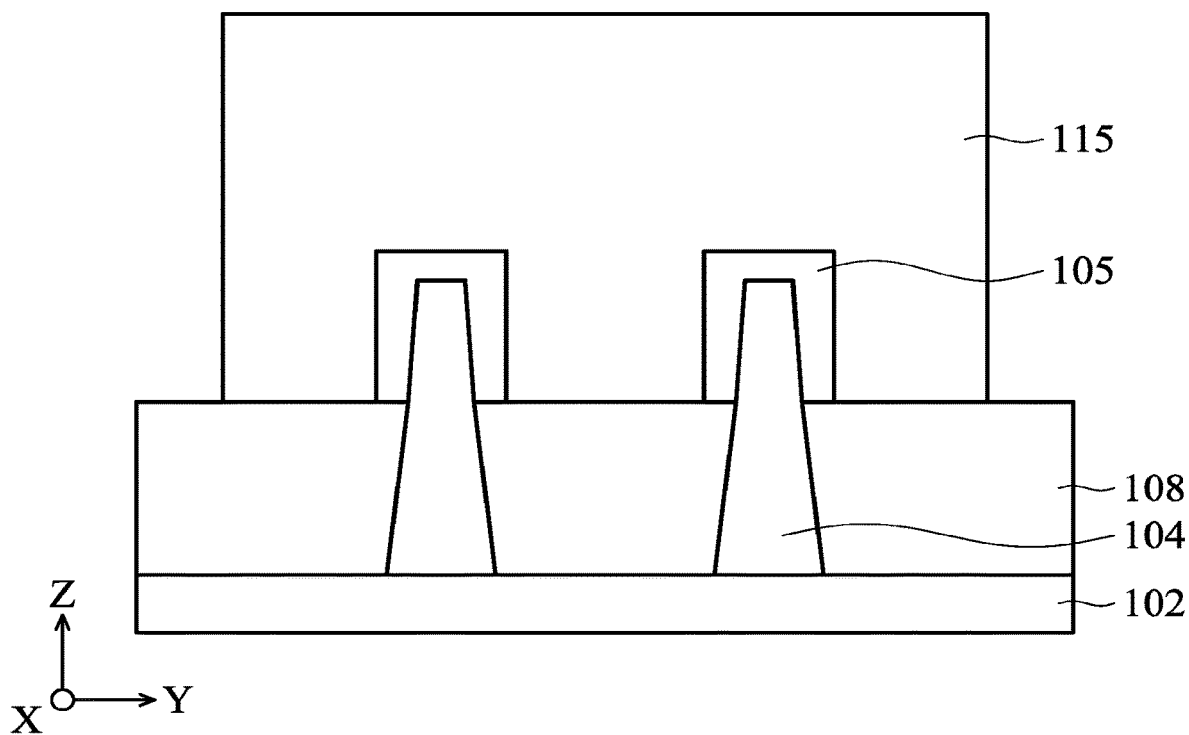

Afterwards, the photoresist (not shown) and BRAC 202 are removed by an etching process as shown in FIG. 2B, in accordance with some embodiments of the disclosure. The etching process may be a dry etching process or a wet etching process. In some embodiments, a first dry etching process is operated at a pressure in a range from about 3 mtorr to about 50 mtorr. In some embodiments, the gas used in the first dry etching process includes methane ($CH_4$), nitrogen ($N_2$), helium (He), oxygen ($O_2$) or combinations thereof. In some embodiments, the first dry etching process is operated by a power in a range from about 50 W to about 1000 W. In some embodiments, the first dry etching process is operated at a temperature in range from about 20° C. to about 80° C.

Figure 2C:
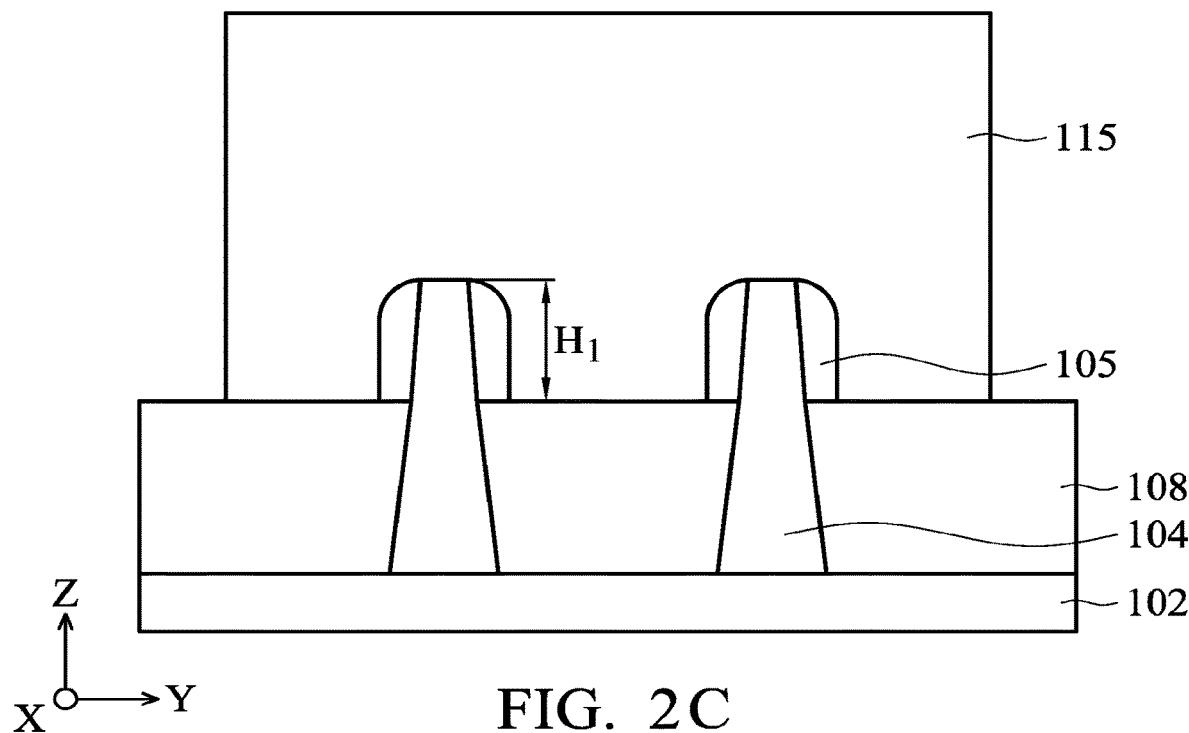

After the BRAC 202 is removed, a portion of the gate sidewall spacers 115 and a portion of the fin sidewall spacers 105 are removed as shown in FIG. 2C, in accordance with some embodiments of the disclosure. More specifically, a top portion of the gate sidewall spacers 115 is removed to expose the second hard mask layer 114. A top portion of the fin sidewall spacers 105 is removed to expose the fin structure 104.

In some embodiments, when the gate sidewall spacers 115 and the fin sidewall spacers 105 are made of silicon nitride, a second etching process is performed to remove the silicon nitride. In some embodiments, the second etching process is a second dry etching process and is operated at a pressure in a range from about 3 mtorr to about 50 mtorr. In some embodiments, the gas used in the second dry etching process includes fluoromethane ($CH_3F$), difluoromethane ($CH_2F_2$), methane ($CH_4$), argon (Ar), hydrogen bromide (HBr) nitrogen ($N_2$), helium (He), oxygen ($O_2$) or combinations thereof. In some embodiments, the second dry etching process is operated by a power in a range from about 50 W to about 1000 W. In some embodiments, the second dry etching process is operated at a temperature in range from about 20° C. to about 70° C.

After the second dry etching process, each of the fin sidewall spacers 105 has a first height $H_1$. In some embodiments, the first height $H_1$ is in a range from about 0.1 nm to about 100 nm.

Figure 2D:
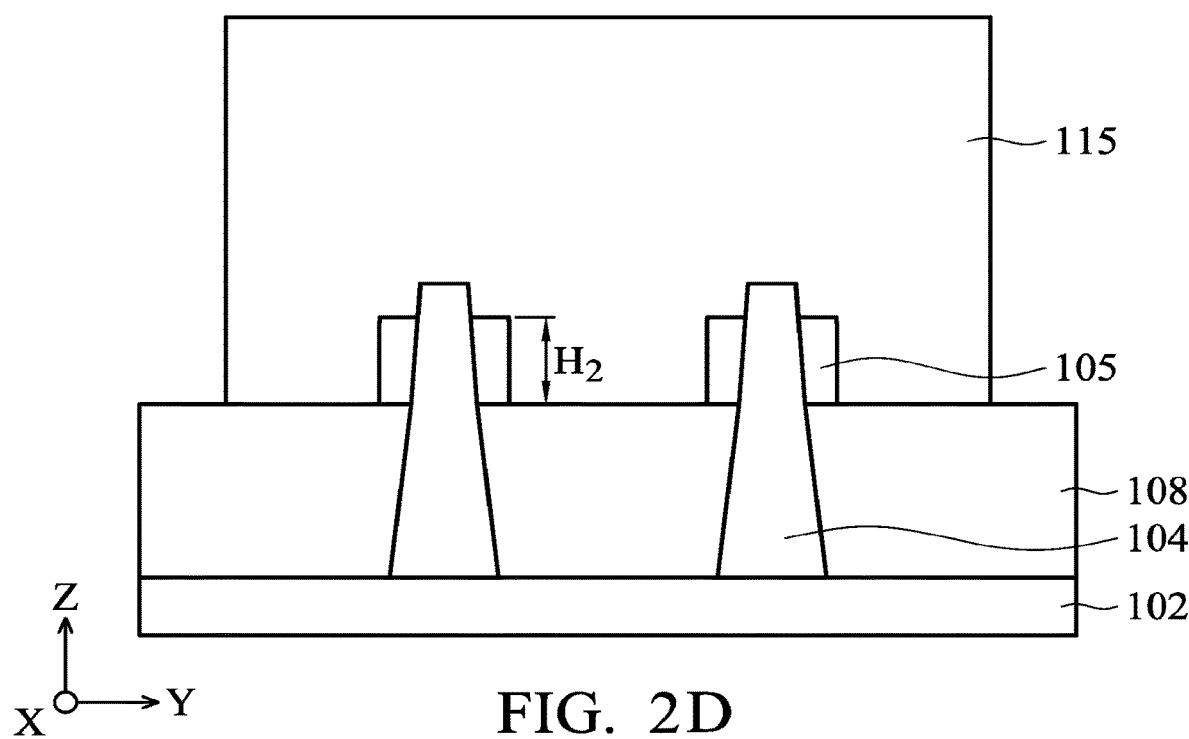

After the portion of the gate sidewall spacers 115 and the portion of the fin sidewall spacers 105 are removed, a portion of the remaining fin sidewall spacers 105 is removed as shown in FIG. 2D, in accordance with some embodiments of the disclosure. The upper portions of the fin sidewall spacers 105 are removed by a third etching process. The third etching process may be a dry etching process or a wet etching process.

In some embodiments, the third etching process is a third dry etching process and is operated at a pressure in a range from about 3 mtorr to about 50 mtorr. In some embodiments, the gas used in the third dry etching process includes fluoromethane (CH$_3$F), difluoromethane (CH$_2$F$_2$), methane (CH$_4$), argon (Ar), hydrogen bromide (HBr) nitrogen (N$_2$), helium (He) or oxygen (O$_2$) or combinations thereof. In some embodiments, the third dry etching process is operated by a power in a range from about 50 W to about 1000 W. In some embodiments, the third dry etching process is operated at a temperature in range from about 20° C. to about 70° C.

After the third dry etching process, the height of the fin sidewall spacers 105 is reduced from the first height H$_1$ to a second height H$_2$. In some embodiments, the second height H$_2$ is in a range from about 0.1 nm to about 90 nm.

Figure 2E:
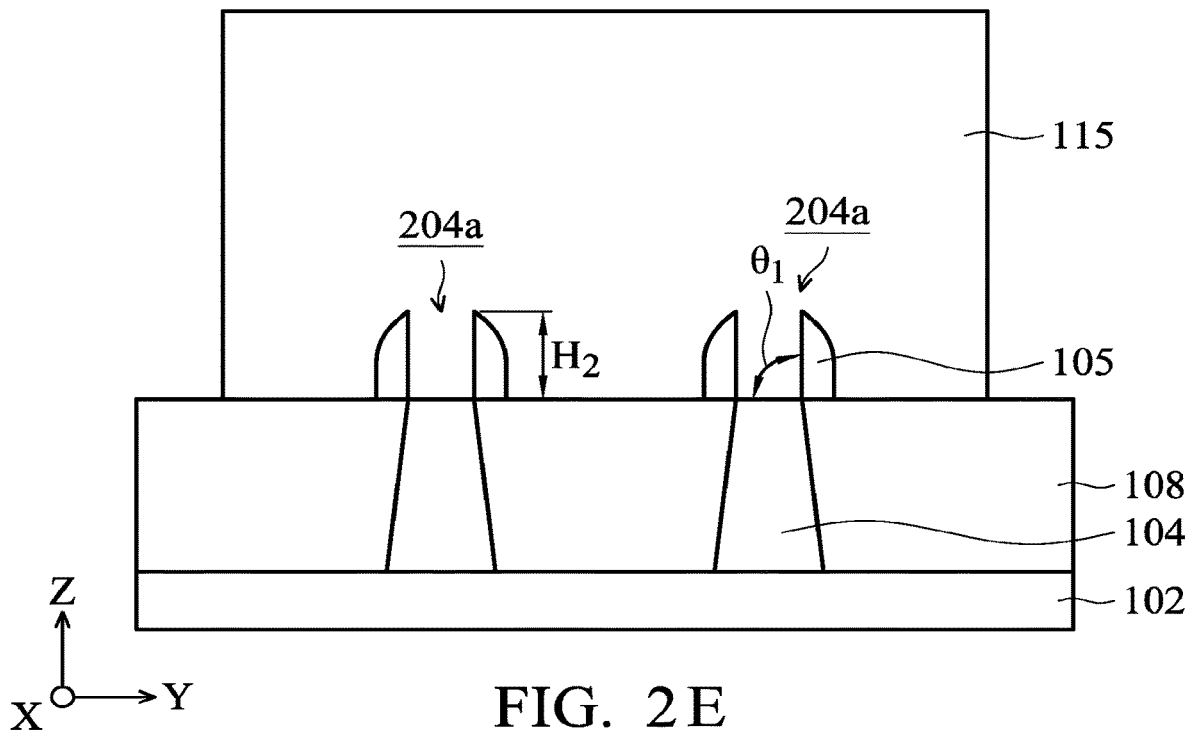
Figure 2F:
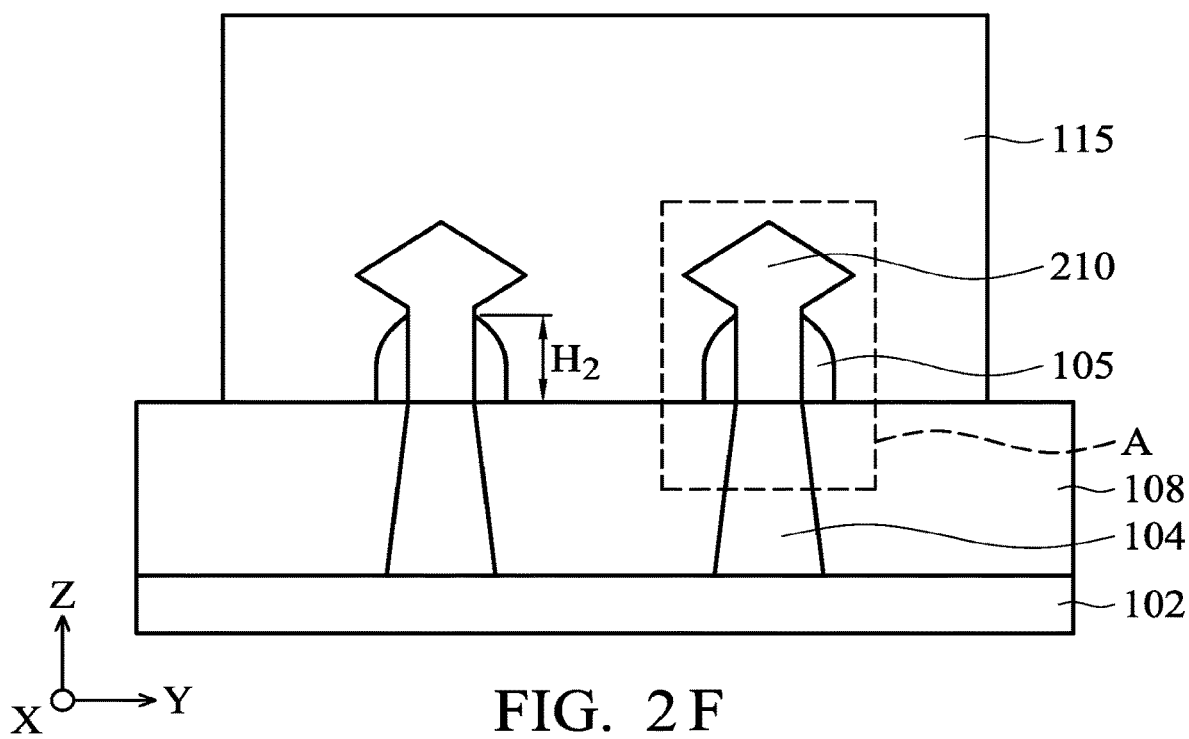

It should be noted that the second height H$_2$ of the fin sidewall spacers 105 is critical to an epitaxial structure (such as epitaxial structure 210 in FIG. 2F). The height and volume of the epitaxial structure are affected by the second height H$_2$ of the fin sidewall spacers 105. In other words, the fin sidewall spacers 105 are configured to control the volume and the height of the epitaxial structure 210.

After the third dry etching process, a portion of the fin structure 104 is removed as shown in FIG. 2E, in accordance with some embodiments of the disclosure. The fin structure 104 is removed by an etching process, such as a dry etching process or a wet etching process.

As shown in FIG. 2E, a top surface of the remaining fin structure 104 is level with a top surface of the isolation structure 108. A trench 204a is formed by recessing a portion of the fin structure 104 which is located above the isolation structure 108. The sidewalls of the trench 204a are vertical parallel to each other. In some embodiments, an angle θ$_1$ between the sidewall of trench 204a and a top surface of the fin structure 104 is about 90 degrees.

After the portion of the fin structure 104 is removed, an epitaxial structure 210 is formed in the trenches 204a, as shown in FIG. 2F, in accordance with some embodiments of the disclosure.

The epitaxial structure 210 includes source/drain epitaxial structure. In some embodiments, when an N-type FET (NFET) device is desired, the source/drain epitaxial structures include an epitaxially growing silicon (epi Si). Alternatively, when a P-type FET (PFET) device is desired, epitaxial source/drain structures include an epitaxially growing silicon germanium (SiGe).

Figure 2G:
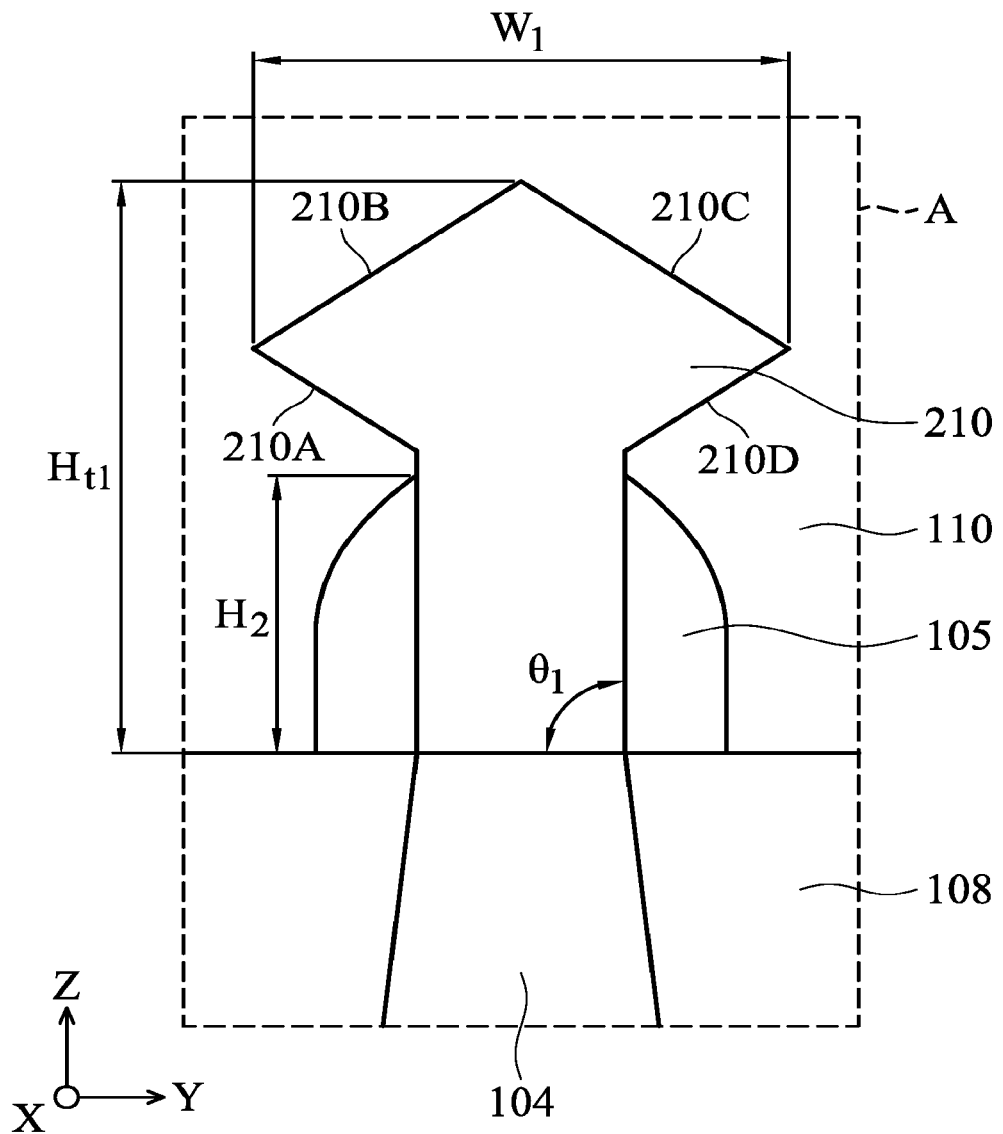
FIG. 2G is an enlarged representation of region A of FIG. 2F, in accordance with some embodiments of the disclosure.

FIG. 2G is an enlarged representation of region A of FIG. 2F, in accordance with some embodiments of the disclosure. As shown in FIG. 2G, the epitaxial structure 210 has a rhombus-like upper portion and a column-like lower portion. The rhombus-like upper portion of the epitaxial structure 210 has four facets 210A, 210B, 210C, and 210D. Each facet has a (111) crystallographic orientation. The column-like lower portion of the epitaxial structure 210 has a bottom surface and sidewalls adjoined to the bottom surface. An angle θ$_1$ between the bottom surface and the sidewalls is about 90 degrees. In addition, the bottom surface of the column-like lower portion of the epitaxial structure 210 is substantially level with a top surface of the isolation structure 108.

As shown in FIG. 2G, the epitaxial structure 210 has a height H$_{t1}$ and a width W$_1$. In some embodiments, the height H$_{t1}$ is in a range from about 10 nm to about 300 nm. If the height H$_{t1}$ is too great, the electric resistance will become lower. If the height H$_{t1}$ is too small, the electric resistance becomes higher to impact device speed. In some embodiments, the width W$_1$ is in a range from about 10 nm to about 100 nm. If the width W$_1$ is too great, the epitaxial structure 210 may merge with neighbor one and cause short circuit effect. If the width W$_1$ is too small, a contact window for contacting with the epitaxial structure 210 will become narrow, and therefore the circuit effect may be broken.

In addition, a ratio (H$_{t1}$/H$_2$) of the height H$_{t1}$ of the epitaxial structure 210 to height H$_2$ of the fin sidewall spacers 105 is in a range from about 1.5 to about 10. If the ratio is too small, fin sidewall can't have effective support to EPI height and cause short EPI structure.

Figure 3A:
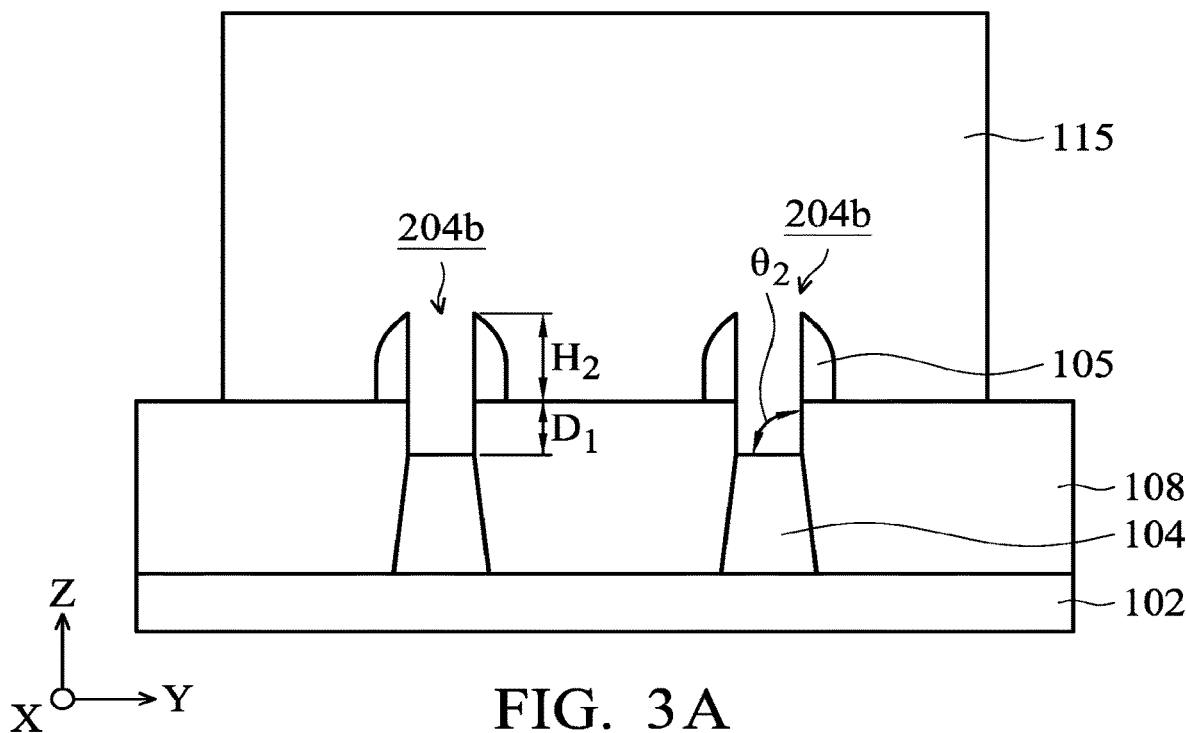
FIGS. 3A-3B show side views of various stages of forming a fin field effect transistor (FinFET) device structure, in accordance with some embodiments of the disclosure.
Figure 3B:
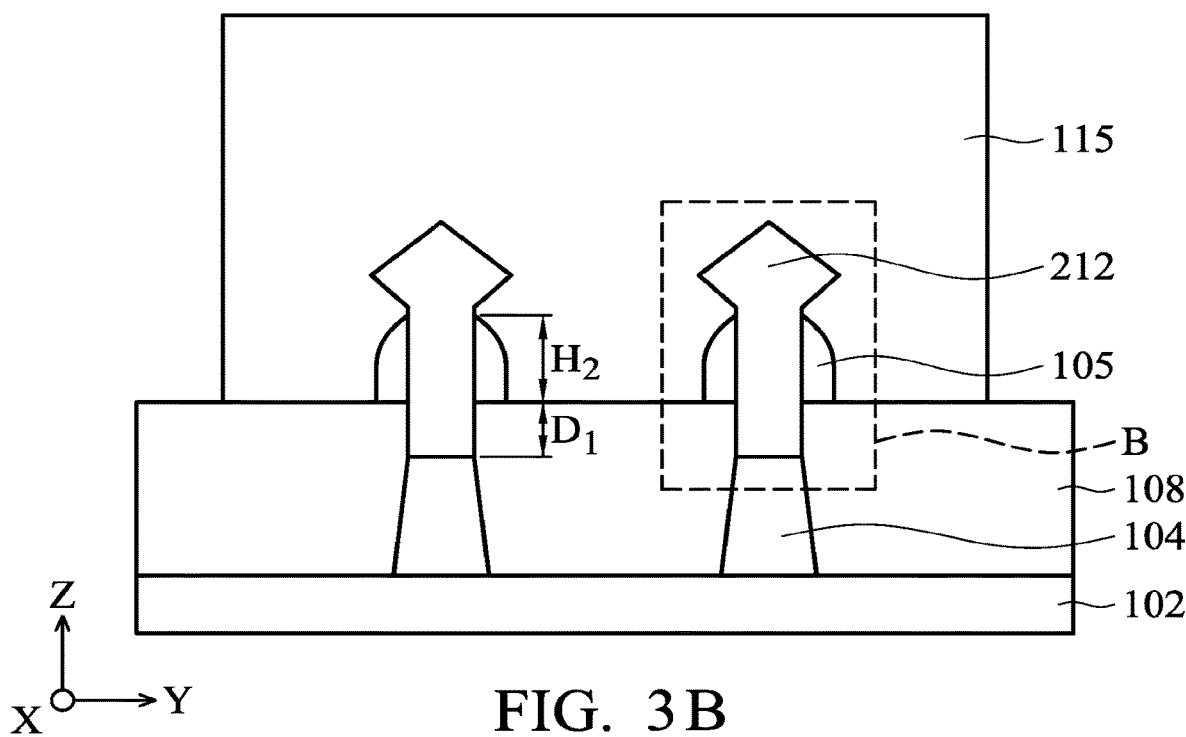

FIGS. 3A-3B show side views of various stages of forming a fin field effect transistor (FinFET) device structure, in accordance with some embodiments of the disclosure.

As shown in FIG. 3A, in some embodiments, a top surface of the remaining fin structure 104 is lower than a top surface of the isolation structure 108. A trench 204b is formed by recessing a portion of the fin structure 104 which is located below the isolation structure 108. In some other embodiments, an angle θ$_2$ between the sidewall of trench 204b and a top surface of the fin structure 104 is about 90 degrees. The trench 204b extends from a top surface of the isolation structure 108 to a depth D$_1$ in a range from about 0.1 nm to about 50 nm.

After the portion of the fin structure 104 is removed, an epitaxial structure 212 is formed in the trenches 204b, as shown in FIG. 3B, in accordance with some embodiments of the disclosure. The epitaxial structure 212 includes source/drain epitaxial structure. In some embodiments, when an N-type FET (NFET) device is desired, the source/drain epitaxial structures include an epitaxially growing silicon (epi Si). Alternatively, when a P-type FET (PFET) device is desired, epitaxial source/drain structures include an epitaxially growing silicon germanium (SiGe).

Figure 3C:
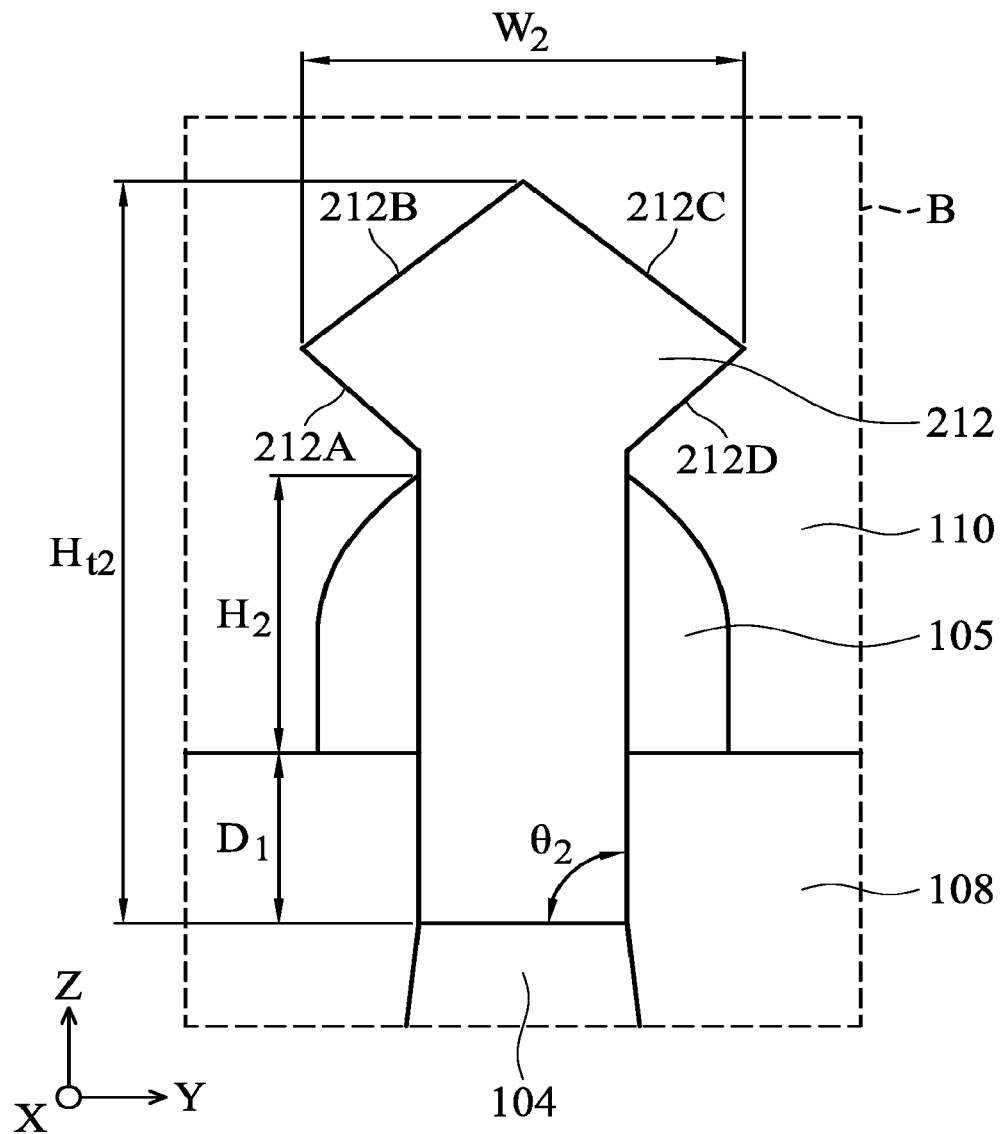
FIG. 3C is an enlarged representation of region B of FIG. 3B, in accordance with some embodiments of the disclosure.

FIG. 3C is an enlarged representation of region B of FIG. 3B, in accordance with some embodiments of the disclosure. As shown in FIG. 3C, the epitaxial structure 212 has a rhombus-like upper portion and a column-like lower portion. The rhombus-like upper portion of the epitaxial structure 212 has four facets 212A, 212B, 212C, and 212D. Each facet has a (111) crystallographic orientation. The column-like lower portion of the epitaxial structure 212 has a bottom surface and sidewalls adjoined to the bottom surface. An angle θ$_2$ between the bottom surface and the sidewalls is about 90 degrees. In addition, the bottom surface of the column-like lower portion of the epitaxial structure 212 is lower than a top surface of the isolation structure 108.

As shown in FIG. 3C, the epitaxial structure 212 has a height H$_{t2}$ and a width W$_2$. The height H$_{t1}$ is smaller than height H$_{t2}$, and the width W$_1$ is greater than width W$_2$. In some embodiments, the height H$_{t2}$ is in a range from 15 nm to about 150 nm. In some embodiments, the width W$_2$ is in a range from about 10 nm to about 100 nm.

The epitaxial structures 210 and an epitaxial structure 212 independently include single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

The epitaxial structures 210 and 212 are formed by an epi process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other applicable epi processes.

The epitaxial structures 210 and 212 may be doped or undoped in-situ during the epi process. For example, the epitaxially grown SiGe epitaxial structure may be doped with boron; and the epitaxially grown Si epitaxial structure may be doped with carbon to form a Si:C epitaxial structure, phosphorous to form a Si:P epitaxial structure, or both carbon and phosphorous to form a SiCP epitaxial structure. The doping may be achieved by an ion implantation process, plasma immersion ion implantation (PIII) process, gas and/or solid source diffusion process, or another suitable process. The epitaxial structures 210 and 212 may further be exposed to annealing processes, such as a rapid thermal annealing process.

If the epitaxial structures 210 and 212 are not doped in-situ, a second implantation process (i.e., a junction implant process) is performed to dope the epitaxial structure 210 and 212.

The fin structure 104 includes a channel region (not shown) surrounded or wrapped by gate electrode 110. The lattice constants of the epitaxial structure 210 and 212 are different from the substrate 102, the channel region are stained or stressed to enable carrier mobility of the FinFET device structure and enhance the FinFET device structure performance.

It should be noted that the volume and the heights $H_{t1}$, $H_{t2}$ of the epitaxial structure 210 and 212 are controlled by adjusting the height $H_2$ of the fin sidewall spacers 105 and/or depth $D_1$. Once the volume and the heights $H_{t1}$, $H_{t2}$ of the epitaxial structure 210 and 212 are well controlled, the performance of the FinFET device structure is further improved. For example, the device mobility (Id_Sat) will gain when the FinFET device structure is improved.

FIGS. 4A-4D show side views of various stages of forming a fin field effect transistor (FinFET) device structure, in accordance with some embodiments of the disclosure. FIG. 4E is an enlarged representation of region C of FIG. 4D, in accordance with some embodiments of the disclosure. FIGS. 4A-4D show side views taken along arrow 1 of FIG. 1 and the arrow 1 is parallel to X-axis direction.

Figure 4A:
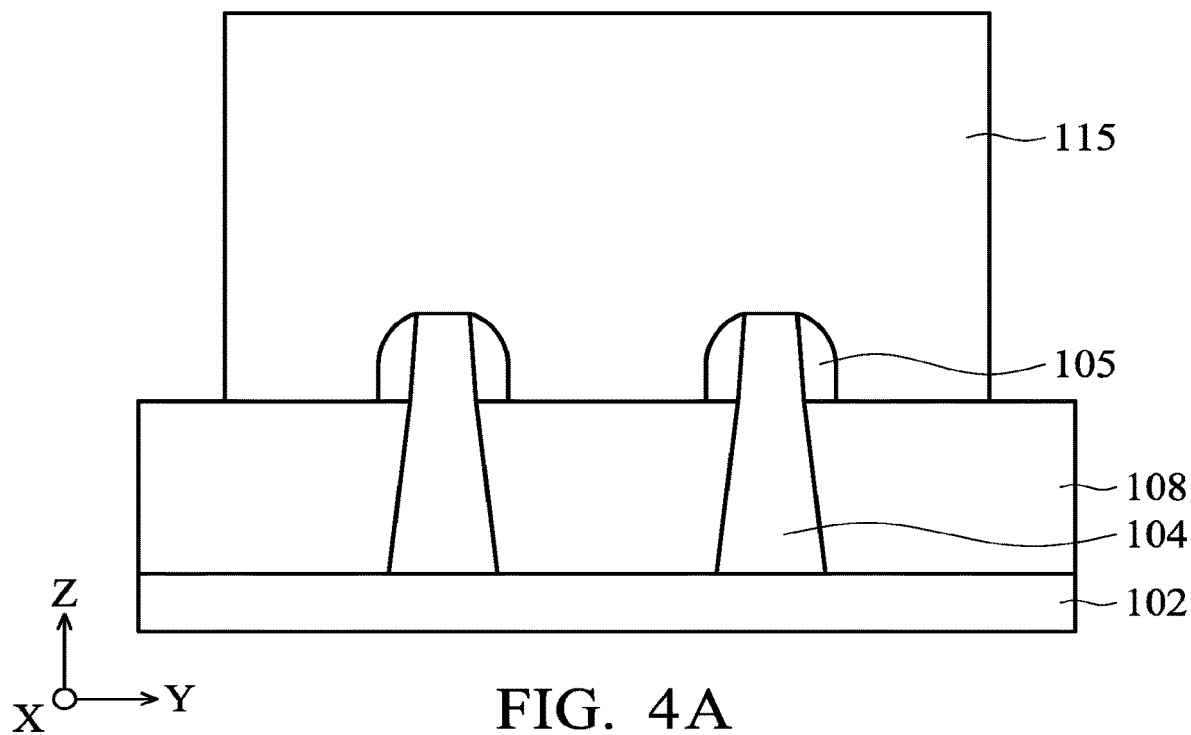
FIGS. 4A-4D show side views of various stages of forming a fin field effect transistor (FinFET) device structure, in accordance with some embodiments of the disclosure.

Referring to FIG. 4A, the gate sidewall spacers 115 are formed on the opposite sidewalls of the gate electrode 110, the fin sidewall spacers 105 are formed on the opposite sidewalls of the fin structure 104.

Figure 4B:
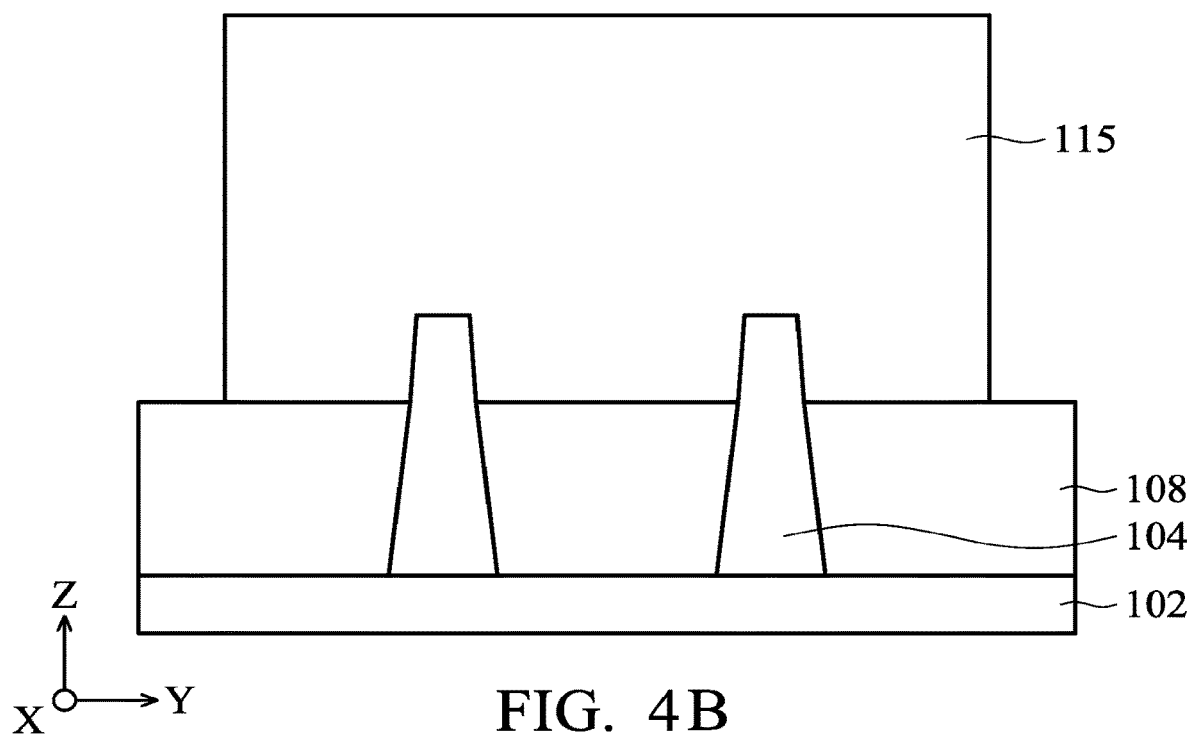

Afterwards, the fin sidewall spacers 105 are completely removed as shown in FIG. 4B, in accordance with some embodiments of the disclosure. As a result, the top surface and a portion of the sidewalls of the fin structure 104 are exposed. No fin sidewall spacers 105 are formed on the fin structure 104.

Figure 4C:
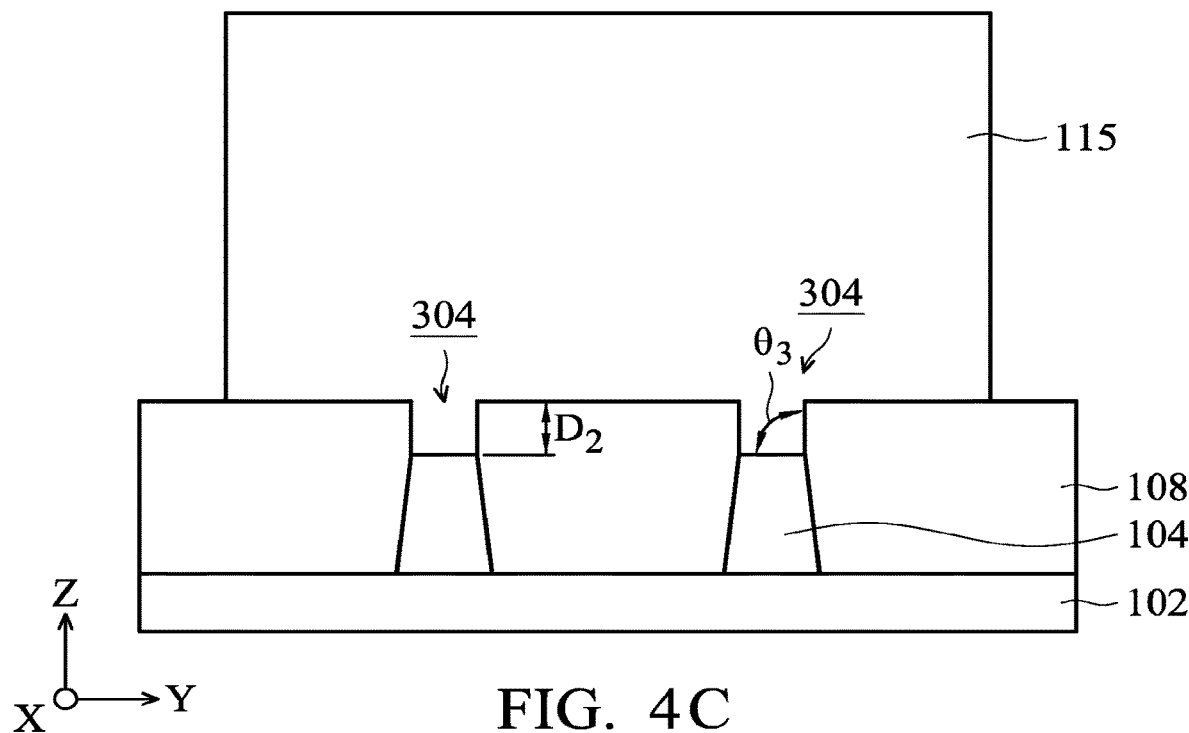

After the fin sidewall spacers 105 are completely removed, a portion of the fin structure 104 is removed as shown in FIG. 4C, in accordance with some embodiments of the disclosure. As a result, a trench 304 is formed by recessing a portion of the fin structure 104.

The trench 304 has a depth $D_2$ which is below the isolation structure 108. In some embodiments, the depth $D_2$ is in a range from about 0.1 nm to about 50 nm. In some embodiments, an angle $\theta_3$ between the sidewall of trench 304 and a top surface of the fin structure 104 is about 90 degrees.

Figure 4D:
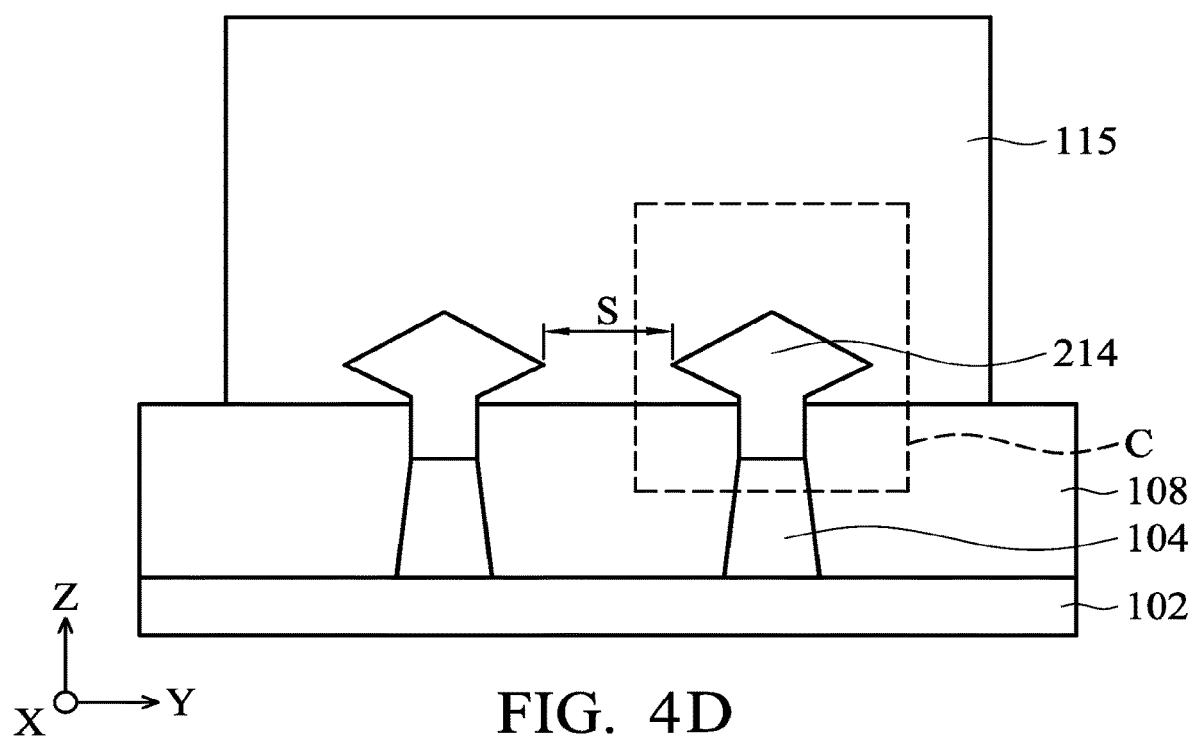
Figure 4E:
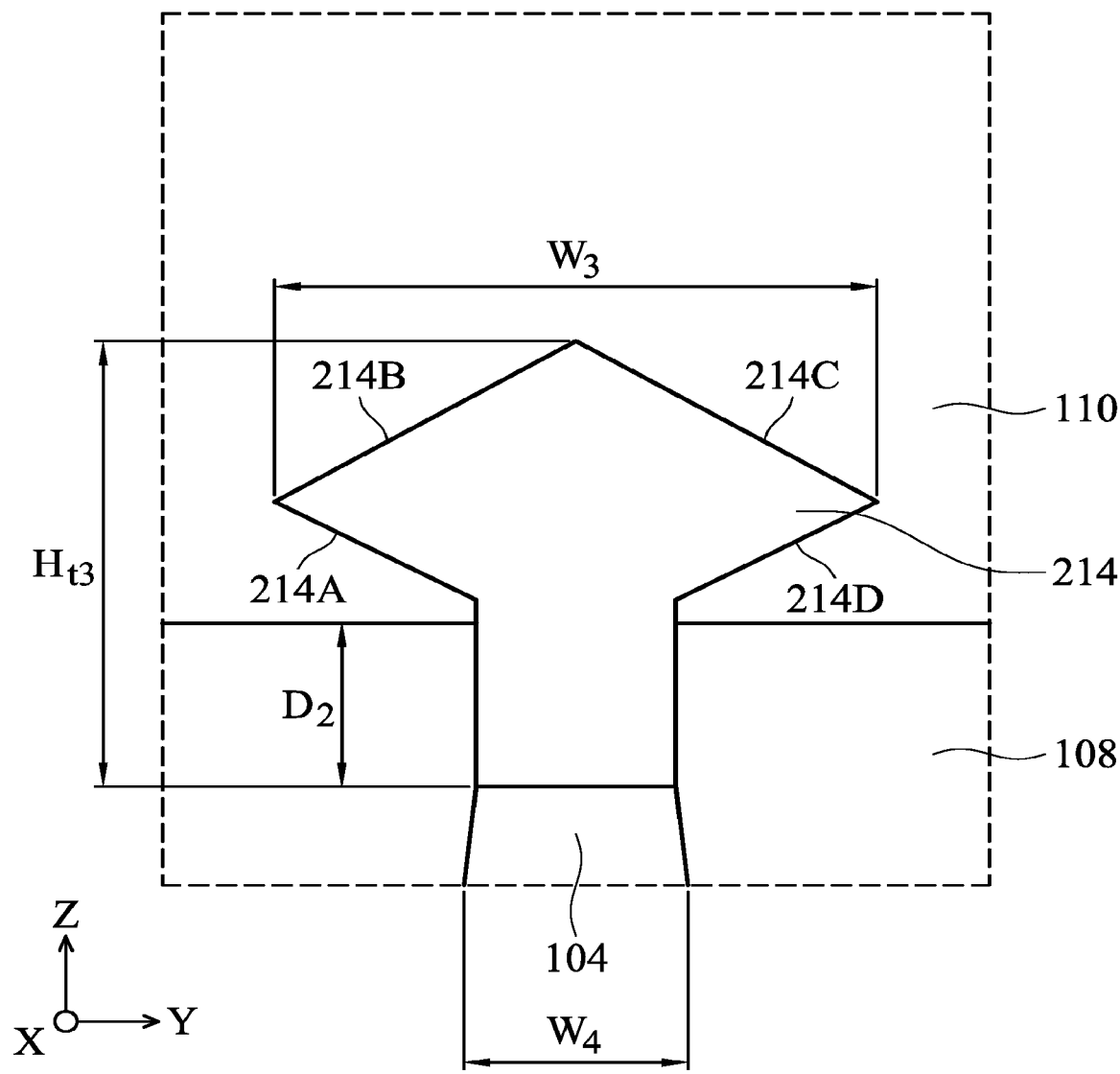
FIG. 4E is an enlarged representation of region C of FIG. 4D, in accordance with some embodiments of the disclosure.

After the portion of the fin structure 104 is removed, an epitaxial structure 214 is formed in the trench 304 and on the fin structure 104 as shown in FIG. 4D, in accordance with some embodiments of the disclosure.

The epitaxial structure 214 includes single element semiconductor material such as germanium (Ge) or silicon (Si); or compound semiconductor materials, such as gallium arsenide (GaAs) or aluminum gallium arsenide (AlGaAs); or semiconductor alloy, such as silicon germanium (SiGe) or gallium arsenide phosphide (GaAsP).

The epitaxial structure 214 is formed by an epi process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Like epitaxial structure 210 and 212, the epitaxial structure 214 has a rhombus-like upper portion and a column-like lower portion. The rhombus-like upper portion of the epitaxial structure 214 has four facets 214A, 214B, 214C, and 214D. Each facet has a (111) crystallographic orientation.

It should be noted that, compared with FIGS. 2G and 3C, no fin sidewall spacers are formed adjacent to the epitaxial structure 214 in FIG. 4E. Therefore, the volume and the height of the epitaxial structure 214 are controlled by adjusting the depth of the trench 304 (shown in FIG. 4C). In addition, because no fin sidewall spacers inhibit the growth of the epitaxial structure 214, the epitaxial structure 214 is prone to growing in the direction of the X-axis. Therefore, the width W3 of the epitaxial structure 214 is greater than the width W4 of the fin structure 104.

The epitaxial structure 214 has a height $H_{t3}$ and a width $W_3$. The height $H_{t3}$ of the epitaxial structure 214 is less than height $H_{t2}$ of the epitaxial structure 212, and the width $W_2$ of the epitaxial structure 212 is greater than width $W_3$ of the epitaxial structure 214. In addition, the height $H_{t3}$ of the epitaxial structure 214 is less than height $H_{t1}$ of the epitaxial structure 210, and the width $W_1$ of the epitaxial structure 210 is greater than width $W_3$ of the epitaxial structure 214.

Referring to FIG. 4D again, a spacing S between two adjacent epitaxial structure 214 is in a range from about 0.1 nm to about 100 nm. In some embodiments, the width W3 of the epitaxial structure 214 is in a range from about 10 nm to about 100 nm. In some embodiments, the height $H_{t3}$ of the epitaxial structure 214 is in a range from about 10 nm to about 300 nm. In some embodiments, the ratio ($H_{t3}/W_3$) of the height to the width of the epitaxial structure 214 is in a range from about 0.1 to about 10.

Afterwards, The FinFET device structure may continue to undergo other processes to form other structures or devices. In some embodiments, metallization includes vertical interconnects, such as conventional vias or contacts, and horizontal interconnects, such as metal lines. The various interconnection features may implement various conductive materials including copper, tungsten, and/or silicide.

Embodiments for forming fin field effect transistor (FinFET) device structure are provided. The FinFET device structure includes a fin structure extending above the substrate and an epitaxial structure formed on the fin structure. In some embodiments, the fin sidewall spacers are formed adjacent to the epitaxial structure. The fin sidewall spacers are configured to control a volume and the height of the epitaxial structure. In some other embodiments, no fin sidewall spacers are formed adjacent to the epitaxial structure, the volume and the height of the epitaxial structure are controlled by adjusting the depth of a trench which is formed by recessing a top portion of the fin structure. Once the volume and the height of the epitaxial structure are controlled, the performance of the FinFET device structure is further improved.

In some embodiments, a fin field effect transistor (FinFET) device structure is provided. The FinFET structure includes a substrate and a fin structure extending above the substrate. The FinFET structure includes an epitaxial structure formed on the fin structure, and the epitaxial structure has a first height. The FinFET structure also includes fin sidewall spacers formed adjacent to the epitaxial structure. The sidewall spacers have a second height and the first height is greater than the second height, and the fin sidewall spacers are configured to control a volume and the first height of the epitaxial structure.

In some embodiments, a fin field effect transistor (FinFET) device structure is provided. The FinFET structure includes a substrate and a fin structure extending above the substrate. The FinFET structure also includes an isolation structure formed on the substrate, and the fin structure is embedded in the isolation structure. The FinFET structure further includes a first epitaxial structure formed on the fin structure, an interface between the first epitaxial structure and the fin structure is below a top surface of the isolation structure, and no fin sidewall spacers are formed adjacent to the first epitaxial structure.

In some embodiments, a method for forming a fin field effect transistor (FinFET) device structure is provided. The method includes providing a substrate and forming a fin structure above the substrate. The method also includes forming a gate stack structure over a central portion of the fin structure and forming gate sidewall spacers on a top surface and sidewalls of the gate stack structure and forming fin sidewall spacers on a top surface and sidewalls the fin structure. The method further includes removing a top portion of gate sidewall spacers and a top portion of the fin sidewall spacers to expose a top portion of the gate stack structure and a top portion of the fin structure. The method includes removing a portion of the fin sidewall spacers, and the fin sidewall spacers have a second height. The method further includes recessing a portion of the fin structure to form a trench. The method also includes epitaxially growing a epitaxial structure from the trench, and the epitaxial structure is formed over the fin structure, and the epitaxial structure has a first height and the first height is greater than the second height.

One general aspect includes a method for forming a fin field effect transistor (FinFET) device structure, including: providing a substrate; forming a fin structure above the substrate; forming a gate stack structure over a central portion of the fin structure; forming gate sidewall spacers on a top surface and sidewalls of the gate stack structure and forming fin sidewall spacers on a top surface and sidewalls the fin structure; removing a top portion of the gate sidewall spacers and a top portion of the fin sidewall spacers to expose a top portion of the gate stack structure and a top portion of the fin structure; removing a portion of the fin sidewall spacers, where the fin sidewall spacers have a second height; recessing a portion of the fin structure to form a trench; and epitaxially growing a epitaxial structure from the trench, where the epitaxial structure is formed over the fin structure, and where the epitaxial structure has a first height ($H_{t1}$) and the first height is greater than the second height ($H_2$).

One general aspect of embodiments disclosed herein includes a method for forming a fin field effect transistor (FinFET) device structure, including: providing a substrate; forming a fin structure above the substrate; forming a gate stack structure over a central portion of the fin structure; forming gate sidewall spacers on a top surface and sidewalls of the gate stack structure and forming fin sidewall spacers on a top surface and sidewalls the fin structure; removing a top portion of gate sidewall spacers and a top portion of the fin sidewall spacers to expose a top portion of the gate stack structure and a top portion of the fin structure; removing a portion of the fin sidewall spacers, where the fin sidewall spacers have a second height; recessing a portion of the fin structure to form a trench; and epitaxially growing a epitaxial structure from the trench, where the epitaxial structure is formed over the fin structure, and where the epitaxial structure has a first height ($H_{t1}$) and the first height is greater than the second height ($H_2$), and where the epitaxial structure has a rhombus-like upper portion and a column-like lower portion, where the rhombus-like upper portion is entirely above a top of the fin sidewall spacers, and a junction between the rhombus-like upper portion and the sidewall of a column-like lower portion is higher than the top of the fin sidewall spacers, and further where a bottom surface of the column-like lower portion is level with a bottom surface of the fin sidewall spacers.

Yet another general aspect of embodiments disclosed herein includes a method including: forming fin sidewall spacers on sidewalls of a semiconductor fin structure; recessing a portion of the semiconductor fin structure to form a recess between the fin sidewall spacers; epitaxially growing a column-like epitaxial structure within the recess; and epitaxially growing the epitaxial structure to extend above the recess, where the epitaxial structure forms a rhombus-like portion above the recess and above a topmost surface of the fin sidewall spacers, where a junction between the rhombus-like portion and the column-like epitaxial structure is above a topmost surface of the fin sidewall spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
   forming a fin structure above a substrate;
   forming an isolation structure over the substrate, a top surface of the fin structure being above a topmost surface of the isolation structure;
   forming a gate stack structure over a central portion of the fin structure;
   forming gate sidewall spacers on a top surface and sidewalls of the gate stack structure and forming fin sidewall spacers on the top surface and sidewalls the fin structure;
   removing a top portion of the gate sidewall spacers and a top portion of the fin sidewall spacers to expose a top portion of the gate stack structure and a top portion of the fin structure, wherein the topmost surface of the fin sidewall spacers has a first height above the substrate, and wherein at least a portion of the topmost surface of the isolation structure is not covered by the gate sidewall spacers and the fin sidewall spacers before removing the top portion of the gate sidewall spacers and the top portion of the fin sidewall spacers;
after removing a top portion of the fin sidewall spacers, removing a portion of the fin sidewall spacers, wherein the topmost surface of the fin sidewall spacers has a second height above the substrate that is less than the first height;
recessing a portion of the fin structure to form a trench; and
epitaxially growing a epitaxial structure from the trench, wherein the epitaxial structure is formed over the fin structure, and wherein the epitaxial structure has a third height above the substrate and the third height is greater than the second height.

2. The method for forming the FinFET device structure as claimed in claim 1, wherein forming the gate stack structure over the central portion of the fin structure comprises:
forming a gate electrode on the fin structure;
forming a first hard mask layer on the gate electrode; and
forming a second hard mask layer on the first hard mask layer.

3. The method for forming the FinFET device structure as claimed in claim 1, wherein a bottom surface of the epitaxial structure is formed level with or below the topmost surface of the isolation structure.

4. The method for forming the FinFET device structure as claimed in claim 3, wherein recessing the portion of the fin structure to form the trench further comprises:
removing the portion of the fin structure until a top surface of the fin structure is level with or below the topmost surface of the isolation structure.

5. The method for forming the FinFET device structure as claimed in claim 3, before epitaxially growing the epitaxial structure, further comprises:
removing all of the fin sidewall spacers; and
removing a portion of the fin structure until a top surface of the fin structure is below the topmost surface of the isolation structure.

6. The method for forming the FinFET device structure as claimed in claim 1, wherein forming the fin structure includes a double-patterning lithography process.

7. The method for forming the FinFET device structure as claimed in claim 1, wherein removing the top portion of the gate sidewall spacers and the top portion of the fin sidewall spacers includes a dry etching a silicon nitride layer.

8. The method for forming the FinFET device structure as claimed in claim 1, wherein recessing the portion of the fin structure to form the trench includes recessing the portion of the fin structure to have a top surface level with the topmost surface of the isolation structure.

9. The method for forming the FinFET device structure as claimed in claim 1, wherein removing the portion of the fin sidewall spacers includes completely removing the fin sidewall spacers.

10. A method for forming a fin field effect transistor (FinFET) device structure, comprising:
forming a fin structure above a substrate;
forming an isolation structure on the substrate, a top surface of the fin structure being above a topmost surface of the isolation structure;
forming a gate stack structure over a central portion of the fin structure;
forming gate sidewall spacers on a top surface and sidewalls of the gate stack structure and forming fin sidewall spacers on the top surface and sidewalls the fin structure, the fin sidewall spacers consisting of a homogenous material;
removing a top portion of the gate sidewall spacers and a top portion of the fin sidewall spacers to expose a top portion of the gate stack structure and a top portion of the fin structure, wherein a portion of the isolation structure remains exposed after forming the gate sidewall spacers and the fin sidewall spacers and before removing the top portion of the gate sidewall spacers and the top portion of the fin sidewall spacers;
removing a portion of the fin sidewall spacers, wherein the fin sidewall spacers have a first height;
recessing a portion of the fin structure to form a trench; and
epitaxially growing a epitaxial structure from the trench, wherein the epitaxial structure is formed over the fin structure, wherein the epitaxial structure has a second height and the second height is greater than the first height, wherein the epitaxial structure has a rhombus-like upper portion and a column-like lower portion, wherein the rhombus-like upper portion is entirely above a top of the fin sidewall spacers, and a junction between the rhombus-like upper portion and the sidewall of the column-like lower portion is higher than the top of the fin sidewall spacers, and further wherein a bottom surface of the column-like lower portion is level with a bottom surface of the fin sidewall spacers.

11. The method for forming the FinFET device structure as claimed in claim 10, wherein forming the gate sidewall spacers on the top surface and the sidewalls of the gate stack structure and forming the fin sidewall spacers on the top surface and the sidewalls the fin structure includes depositing a silicon nitride layer on the gate stack structure and the fin structure.

12. The method for forming the FinFET device structure as claimed in claim 10, wherein removing the top portion of the gate sidewall spacers and the top portion of the fin sidewall spacers includes at least one dry etching process.

13. The method for forming the FinFET device structure as claimed in claim 12, wherein the at least one dry etching process includes a first dry etching process using an etchant gas selected from the group consisting of fluoromethane ($CH_3F$), difluoromethane ($CH_2F_2$), methane ($CH_4$), argon (Ar), hydrogen bromide (HBr), nitrogen ($N_2$), helium (He), oxygen ($O_2$), and combinations thereof.

14. The method for forming the FinFET device structure as claimed in claim 10, further comprising doping the epitaxial structure.

15. The method for forming the FinFET device structure as claimed in claim 10, wherein doping the epitaxial structure includes a process selected from the group consisting of ion implantation process, plasma immersion ion implantation (PIII) process, gas and solid source diffusion process, and in situ doping.

16. The method for forming the FinFET device structure as claimed in claim 10, wherein removing the portion of the fin sidewall spacers includes completely removing the fin sidewall spacers.

17. A method comprising:
forming fin sidewall spacers on sidewalls of a semiconductor fin structure, the semiconductor fin structure extending through an isolation structure, wherein forming the fin sidewall spacers comprises:
forming a dielectric layer over the semiconductor fin structure and the isolation structure, the dielectric layer covering the sidewalls and a top surface of the semiconductor fin structure and exposing at least a portion of the isolation structure; and etching the dielectric layer to expose the top surface of the semiconductor fin structure;

recessing a portion of the semiconductor fin structure to form a recess between the fin sidewall spacers;

epitaxially growing within the recess an epitaxial structure having a column-like shape; and epitaxially growing the epitaxial structure to extend above the recess, wherein the epitaxial structure forms a rhombus-like portion above the column-like shape within the recess and above a topmost surface of the fin sidewall spacers, wherein a junction between the rhombus-like portion and the column-like shape of the epitaxial structure is above the topmost surface of the fin sidewall spacers.

18. The method as claimed in claim 17, further comprising doping the epitaxial structure with a dopant.

19. The method as claimed in claim 17, wherein a floor of the recess is substantially level with a topmost surface of an isolation layer adjacent the semiconductor fin structure.

20. The method as claimed in claim 17, further comprising removing the fin sidewall spacers.

\* \* \* \* \*